US012594578B2

(12) United States Patent
Kinjo et al.

(10) Patent No.: US 12,594,578 B2
(45) Date of Patent: Apr. 7, 2026

(54) STRUCTURAL MEMBER

(71) Applicant: TOTO LTD., Fukuoka (JP)

(72) Inventors: Atsushi Kinjo, Fukuoka (JP);
Nobutomo Otsuka, Fukuoka (JP);
Fumito Toda, Fukuoka (JP)

(73) Assignee: TOTO LTD., Fukuoka (JP)

( * ) Notice: Subject to any disclaimer, the term of this
patent is extended or adjusted under 35
U.S.C. 154(b) by 0 days.

(21) Appl. No.: 18/610,530

(22) Filed: Mar. 20, 2024

(65) Prior Publication Data

US 2024/0326088 A1 Oct. 3, 2024

(30) Foreign Application Priority Data

Mar. 28, 2023 (JP) ................................. 2023-051316

(51) Int. Cl.
*C23C 16/44* (2006.01)
*B05D 1/02* (2006.01)

(52) U.S. Cl.
CPC ............ *B05D 1/02* (2013.01); *C23C 16/4404*
(2013.01); *B05D 2490/50* (2013.01)

(58) Field of Classification Search
None
See application file for complete search history.

(56) References Cited

U.S. PATENT DOCUMENTS

| | | | |
|---|---|---|---|
| 2012/0177908 A1* | 7/2012 | Petorak ................... | C23C 24/04 |
| | | | 106/286.1 |
| 2018/0301321 A1* | 10/2018 | Iwasawa ........... | H01J 37/32495 |
| 2020/0071836 A1 | 3/2020 | Kimura et al. | |
| 2022/0115214 A1 | 4/2022 | Xu et al. | |
| 2022/0325399 A1 | 10/2022 | Ishikawa et al. | |
| 2023/0020387 A1 | 1/2023 | Wetzel et al. | |

FOREIGN PATENT DOCUMENTS

| | | |
|---|---|---|
| JP | 2013-531135 A | 8/2013 |
| JP | 2017114724 A | 6/2017 |
| JP | 2022-522752 A | 4/2022 |
| TW | 201731688 A | 9/2017 |
| WO | 2021/065919 A1 | 4/2021 |
| WO | 2021/102075 A1 | 5/2021 |

* cited by examiner

*Primary Examiner* — Michael P. Rodriguez
(74) *Attorney, Agent, or Firm* — Finnegan, Henderson,
Farabow, Garrett & Dunner LLP

(57) ABSTRACT
A structural member 10 includes a base material 100 and a
protective film 200 covering a surface 110 of the base
material 100. When, in a cross-section of the protective film
200 cut perpendicularly to the surface 110, a proportion of
pores per unit area is defined as porosity, the porosity in a
first portion 201 that is a portion of the cross-section is lower
than the porosity in a second portion 202 that is a portion of
the cross-section closer to the base material 100 side thereof
than the first portion 201.

5 Claims, 6 Drawing Sheets

200(201)

P

1 μ m

200(202)

P

1 μ m

STRUCTURAL MEMBER

CROSS-REFERENCE TO RELATED APPLICATION

This application is based upon and claims the benefit of priority from Japanese Patent Application No. 2023-051316, filed on Mar. 28, 2023, the entire contents of which are incorporated herein by reference.

BACKGROUND OF THE INVENTION

Field of the Invention

The present invention relates to a structural member.

Description of the Related Art

Structural members having a protective film on a surface of a base material are used in various fields such as semiconductor manufacturing apparatus. For example, in a plasma etching apparatus, a protective film is formed on a surface of a base material constituting an inner wall of a chamber in order to protect the base material from plasma. As such a protective film, for example, an oxide ceramic such as yttria and a fluoride ceramic such as yttrium fluoride are used. As described in WO2021/102075, a protective film is deposited by using various methods, such as a physical vapor deposition (PVD) method, a chemical vapor deposition (CVD) method, and an aerosol deposition method.

In a process of forming a protective film on a surface of a base material, bubbles may be included in the protective film. It is considered that it should be desirable if there are no bubbles in the protective film in order to fully demonstrate the function of the protective film, such as plasma resistance. Thus, upon deposition of the protective film, deposition conditions are generally determined such that bubbles in the protective film are minimized or reduced as much as possible.

According to experiments conducted by the present inventors, on the other hand, when the entire protective film is formed too densely (i.e., so as not to include bubbles at all), new problems have been found that the protective film is likely to undergo deterioration accompanying a thermal expansion difference due to temperature changes while sufficiently improving plasma resistance.

The present invention has been made in view of these problems, and an object of the present invention is to provide a structural member capable of inhibiting deterioration of protective film accompanying a thermal expansion difference while ensuring plasma resistance.

SUMMARY OF THE INVENTION

In order to solve the aforementioned problems, the structural member according to the present invention includes a base material and a protective film covering a surface of the base material. When, in a cross-section of the protective film cut perpendicularly to the surface, a proportion of pores per unit area is defined as porosity, the porosity in a first portion that is a portion of the cross-section is lower than the porosity in a second portion that is a portion of the cross-section closer to a base material side thereof than the first portion, in this structural member.

In such a structural member, the porosity of the protective film is not uniform in its entirety, and the porosity differs according to a position in a thickness direction. Specifically, the porosity of the first portion that is relatively on a surface side is lower than that of the second portion on a base material side.

In such a configuration, a portion of the protective film on the surface side thereof, the portion that is exposed to plasma, has relatively lower porosity, allowing, for example, the same level of plasma resistance as before to be ensured. The term "plasma resistance" used herein refers, for example, to the ability to inhibit dust generation accompanying deterioration of protective film after having been exposed to plasma under predetermined conditions.

A portion of a protective film on a base material side thereof has relatively higher porosity, resulting in having a lower elastic modulus compared to that in other portions. In other words, deformation is easily absorbed. Thus, when a thermal expansion difference occurs between the base material and the protective film upon temperature change of the structural member, a portion of the protective film on the base material side thereof deforms following the base material, whereas a stress generated in this portion is relatively small. As a result, the deterioration of the protective film accompanying the thermal expansion difference can be inhibited more than before.

According to the present invention, it is possible to provide a structural member capable of inhibiting deterioration of protective film accompanying a thermal expansion difference while ensuring plasma resistance.

DETAILED DESCRIPTION OF THE PREFERRED EMBODIMENT

The present embodiment will be described by referring to the attached drawings. In order to facilitate understanding of the description, an identical constituent is indicated with the same sign as far as possible in each drawing, and duplicated explanations will be omitted.

A structural member 10 according to the present embodiment is used as a member constituting an inner wall of a processing chamber in a semiconductor manufacturing apparatus (not shown), for example, such as a plasma etching apparatus. Note that the application of such structural member 10 is only an example, and should not be limited to the semiconductor manufacturing apparatus, and the structural member 10 is preferably used as a member for an application where durability against plasma is required.

Figure 1:
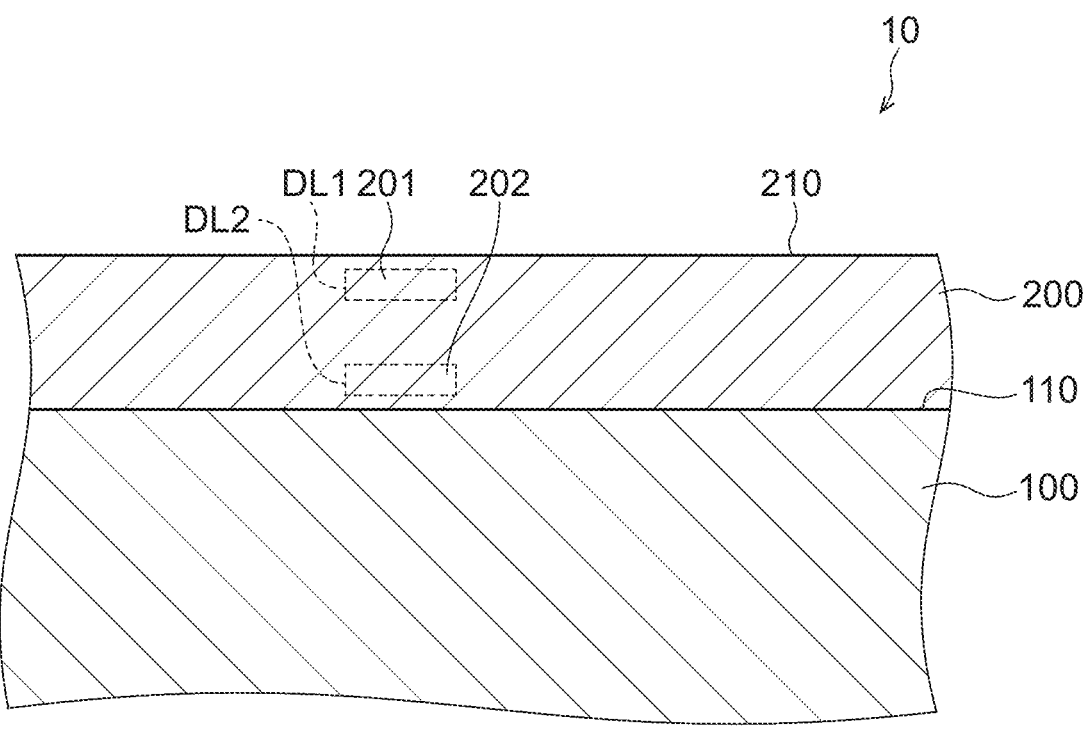
FIG. 1 shows a schematical diagram of a cross-section of the structural member according to the present embodiment.

As shown in FIG. 1, the structural member 10 has a base material 100 and a protective film 200 formed so as to cover a surface 110 of the base material 100. In a plasma etching apparatus, a surface 210 of the protective film 200 is exposed toward a space in the chamber. The protective film 200 of the present embodiment is arranged for the purpose of protecting the base material 100 from plasma. The cross-section shown in FIG. 1 is a cross-section of the structural member 10 cut perpendicularly to the surface 110.

The base material 100 is a member that mostly occupies the entire structural member 10. In the present embodiment, the base material 100 is composed of a sintered ceramic body containing high-purity aluminum oxide (Al2O3). The base material 100 may be a sintered ceramic body made of a material different from the above material, and may be metal depending on applications of the structural member 10.

The protective film 200 is a film formed so as to cover the surface 110 of the base material 100 as described above. In the present embodiment, the protective film 200 is composed of a film containing polycrystalline yttria (Y2O3). The protective film 200 may be a ceramic film made of a different material from the above material.

The protective film 200 according to the present embodiment is formed on the surface 110 of the base material 100 after calcination by using an aerosol deposition method. As is well known, in the aerosol deposition method, microparticles that are materials for the protective film 200, are dispersed in gas to form an "aerosol," which is then injected and brought into collision toward the surface 110. On the surface 110, by the impact of collision, deformation and crushing of microparticles result, thereby allowing the microparticles to be gradually deposited as the protective film 200 while bonded to each other. The surface 210 of the protective film 200 may be a surface itself upon completion of deposition, or it may be a surface that has been subjected to polishing or the like after deposition. The protective film 200 may be a film deposited by a method other than the aerosol deposition method (such as PVD).

A portion surrounded by a dotted line DL1 in FIG. 1, is a portion of the cross-section of the protective film 200 shown in FIG. 1. This portion is hereinafter also denoted as a "first portion 201." A portion surrounded by a dotted line DL2 in the same figure is a portion of the cross-section of the protective film 200 shown in FIG. 1 closer to the base material 100 side than the first portion 201. This portion is hereinafter also denoted as a "second portion 202."

The first portion 201 is a portion of the protective film 200 in the vicinity of the surface 210 thereof, but may be a portion including the surface 210. The second portion 202 is also a portion of the protective film 200 in the vicinity of a surface on a substrate 100 side of the protective film 200 (an interface with base material 100), but may also be a portion including the surface. Note, however, such definitions of the first portion 201 and the second portion 202 are only examples. The first portion 201 may be a portion of the protective film 200 at a different position from the above as long as the first portion 201 is a portion closer to the surface 210 side of the protective film 200 than the second portion 202 thereof. Similarly, the second portion 202 may be a portion of the protective film 200 at a different position from the above as long as the second portion 202 is a portion closer to the base material 100 side of the protective film 200 than the first portion 201 thereof.

Figure 2A:
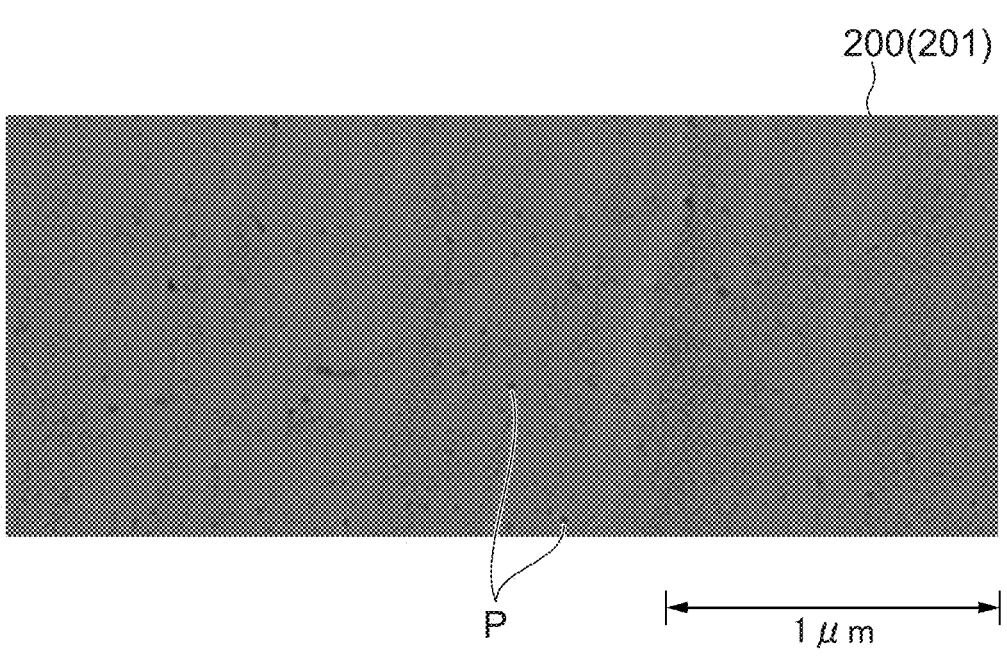
FIG. 2A shows an image obtained by observing a cross-section of the structural member according to the present embodiment with a scanning electron microscope.
Figure 2B:
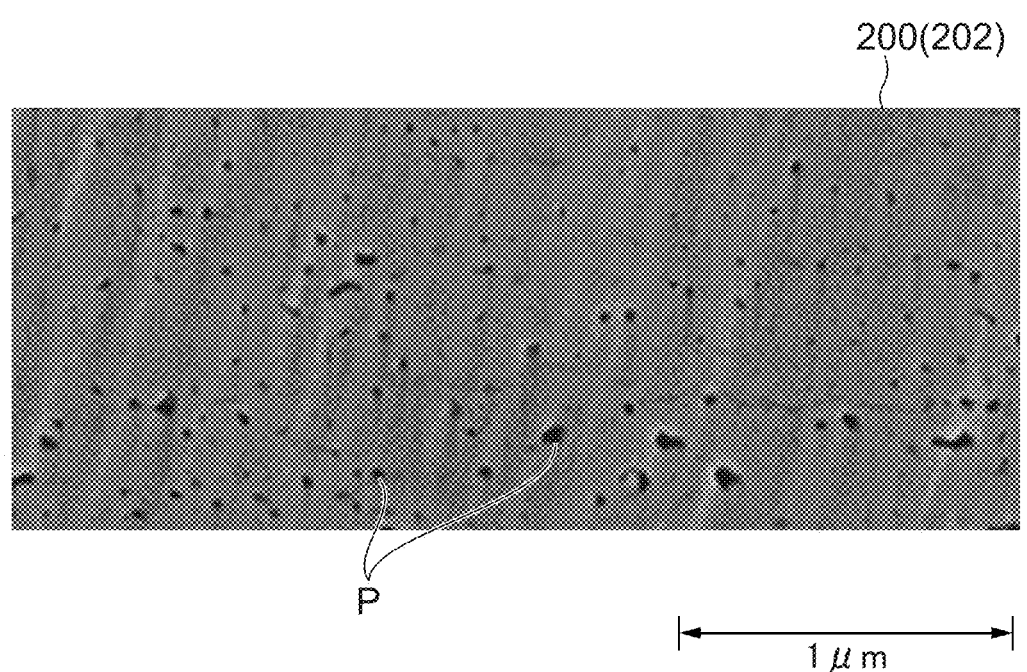
FIG. 2B shows an image obtained by observing a cross-section of the structural member according to the present embodiment with a scanning electron microscope.

FIG. 2A and FIG. 2B show examples of images obtained by observing a cross-section of the protective film 200 with a scanning electron microscope. The image shown in FIG. 2A is an image of the first portion 201, and the image shown in FIG. 2B is an image of the second portion 202. Magnification of each image is the same as each other and the areas are the same as each other.

As shown in FIG. 2A and FIG. 2B, cross-sections of a plurality of pores P included in the protective film 200 appear in each cross-section. Pore P is, for example, a pore formed inside the protective film 200 in a process of depositing the protective film 200.

As is clear from contrasting FIG. 2A with FIG. 2B, the shapes and distribution of each pore P are not uniform in the entire cross-section of the protective film 200, and vary according to position. For example, each pore P included in the first portion 201 in FIG. 2A is larger than each pore P included in the second portion 202 in FIG. 2B.

In a cross-section of the protective film 200 cut perpendicularly to the surface 110, a proportion of pores per unit area is hereinafter defined as "porosity." The porosity is an index calculated separately for each portion of a crosssection of the protective film 200 including the first portion 201 and the second portion 202. The above "unit area" may be an area that is large enough to encompass a plurality of pores P, and can be arbitrarily set. For example, the same area as each of the first portion 201 and second portion 202 shown in FIG. 2A and FIG. 2B may be set as the "unit area" described above.

In the present embodiment, shapes and distribution of pores P in a cross-section of the protective film 200 are adjusted so that the porosity in the first portion 201 is lower than the porosity in the second portion 202.

Figure 3A:
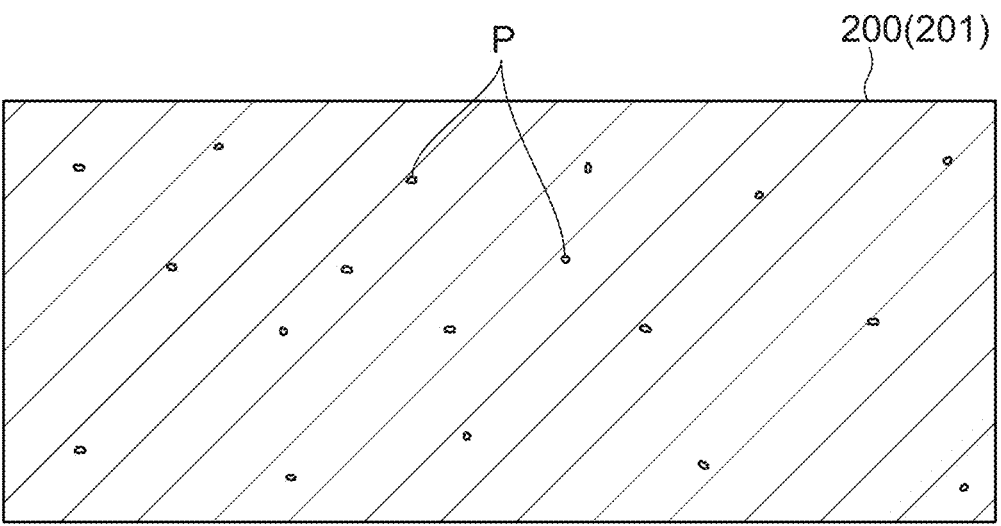
FIG. 3A shows a schematic diagram of a cross-section of the structural member according to the present embodiment.
Figure 3B:
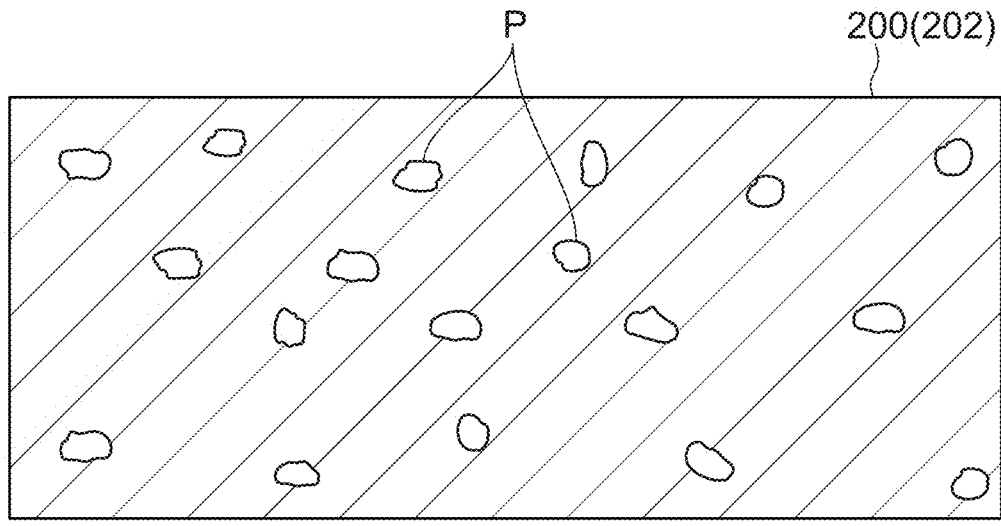
FIG. 3B shows a schematic diagram of a cross-section of the structural member according to the present embodiment.

In FIG. 3A and FIG. 3B, cross-sections corresponding to each of the images in FIG. 2A and FIG. 2B, are depicted as schematic cross-sectional diagrams illustrating the shapes and distributions of pores P. FIG. 3A schematically shows the shapes and distribution of pores P in the first portion 201, and FIG. 3B schematically shows the shapes and distribution of pores P in the second portion 202.

In the examples in FIG. 3A and FIG. 3B, the number of pores P per unit area in the first portion 201 and the number of pores P per unit area in the second portion 202 are approximately equal to each other. Meanwhile, an average value of cross-sectional areas per pore of pores P included in the first portion 201 is smaller than an average value of cross-sectional areas per pore of pores P included in the second portion 202. Thus, in the present embodiment, as a result of allowing the cross-sectional area per pore P to differ, the porosity in the first portion 201 is lower than the porosity in the second portion 202.

The reason for having adopted such a configuration will be explained below. A portion on the surface 210 side of the protective film 200 including the first portion 201 thereof, that is, the portion on the surface 210 side exposed to plasma, is a dense film with relatively low porosity. Therefore, deterioration of the surface 210 when exposed to plasma is unlikely to occur, and falling off of particles (also called dust generation) from the surface 210 is also unlikely to occur. In other words, at least the portion of the protective film 200 on the surface 210 thereof, is ensured for high level of plasma resistance, at least to the same extent as before, and deterioration of the protective film 200 due to the falling off of particles is less likely to occur.

In terms of ensuring the plasma resistance of the protective film 200, the porosity of the protective film 200 is preferably low. Therefore, the porosity seems to be favorably as low as possible in the entire cross-section of the protective film 200, including not only the first portion 201 but also the second portion 202.

However, the present inventors conducted experiments and have newly found that a protective film 200 formed too densely in its entirety (i.e., so as not to include bubbles at all) is likely to undergo deterioration accompanying a thermal expansion difference upon temperature change while sufficiently improving plasma resistance. The phrase "thermal expansion difference upon temperature change" refers to a thermal expansion difference between the base material 100 and the protective film 200, when temperature of the entire structural member 10 changes.

Therefore, as the countermeasure in the present embodiment, a distribution and sizes of pores P in each portion of the protective film 200 are adjusted so that the porosity in the first portion 201 is lower than that in the second portion 202.

In such a configuration of the present embodiment, the portion of the protective film 200 on the base material 100 side thereof has relatively higher porosity, resulting in a lower elastic modulus than that of other portions. In other words, deformation is easily absorbed. Thus, when thermal expansion difference occurs between the base material 100 and the protective film 200 upon temperature change of the structural member 10, the portion of the protective film 200 on the base material 100 side thereof deforms following the base material 100, whereas a stress generated in that portion is retained relatively small. As a result, the deterioration of the protective film 200 accompanying the thermal expansion difference can be inhibited more than before. In other words, the structural member 10 according to the present embodiment can inhibit the deterioration of the protective film 200 accompanying the thermal expansion difference while ensuring at least the same level of plasma resistance as before.

Figure 4:
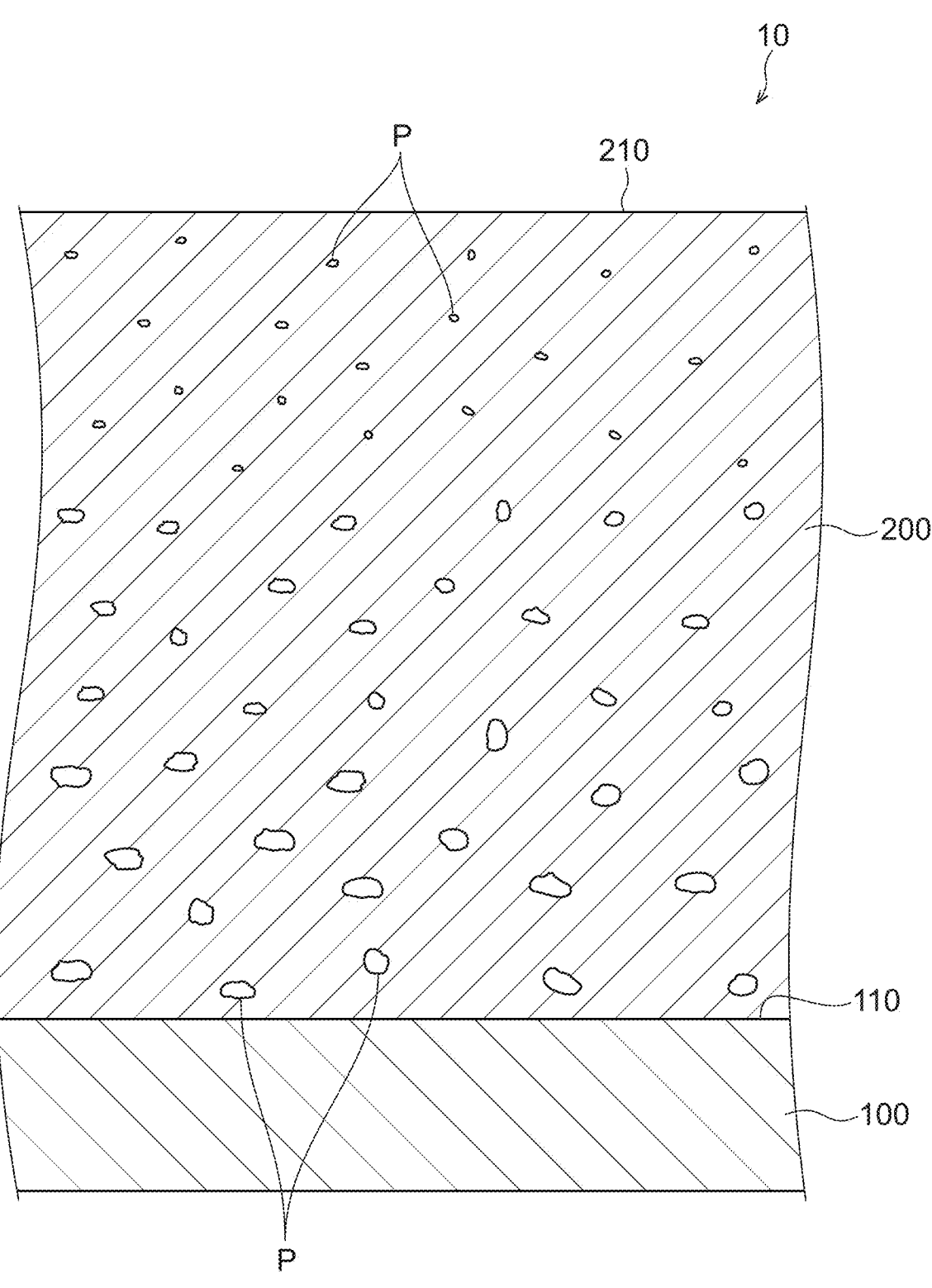
FIG. 4 shows a schematic diagram of a cross-section of the structural member according to the present embodiment.

FIG. 4 schematically depicts the distribution of pores P in the entire range from the surface 210 of the protective film 200 to the surface 110 thereof. It is noted that FIG. 4 is only a schematic diagram, and therefore, the size of pores P with respect to a thickness of the protective film 200 and the like are different from actual sizes.

As shown in FIG. 4, in the protective film 200 of the present embodiment, over the entire range from the surface 210 to the surface 110, the cross-sectional area per pore P gradually decreases with increasing distance from the base material 100. Accordingly, the porosity value in each portion of the protective film 200 gradually (i.e., continuously) decreases with increasing distance from the base material 100, and as a result, the porosity in the first portion 201 and the second portion 202 differs from each other.

The value of porosity in each portion of the protective film 200 may vary continuously, as in the present embodiment, or stepwise vary, according to a position in a depth direction perpendicularly to the surface 110 (vertical directions in FIG. 3A and FIG. 3B).

The porosity in each of the first portion 201 and the second portion 202 may be adjusted in a manner different from that of the present embodiment (FIG. 3A, FIG. 3B, and FIG. 4). For example, in each of configurations of modifications shown in FIG. 5A and FIG. 5B, an average value of cross-sectional areas per pore of pores P included in the first portion 201 (FIG. 5A) and an average value of cross-sectional areas per pore of pores P included in the second portion 202 (FIG. 5B) are approximately equal to each other.

Meanwhile, the number of pores P per unit area in the first portion 201 is smaller than the number of pores P per unit area in the second portion 202. As in this modification, the porosity in each of the first portion 201 and the second portion 202 may be adjusted by a density of pore P arranged, not by a cross-sectional area per pore P.

Figure 5A:
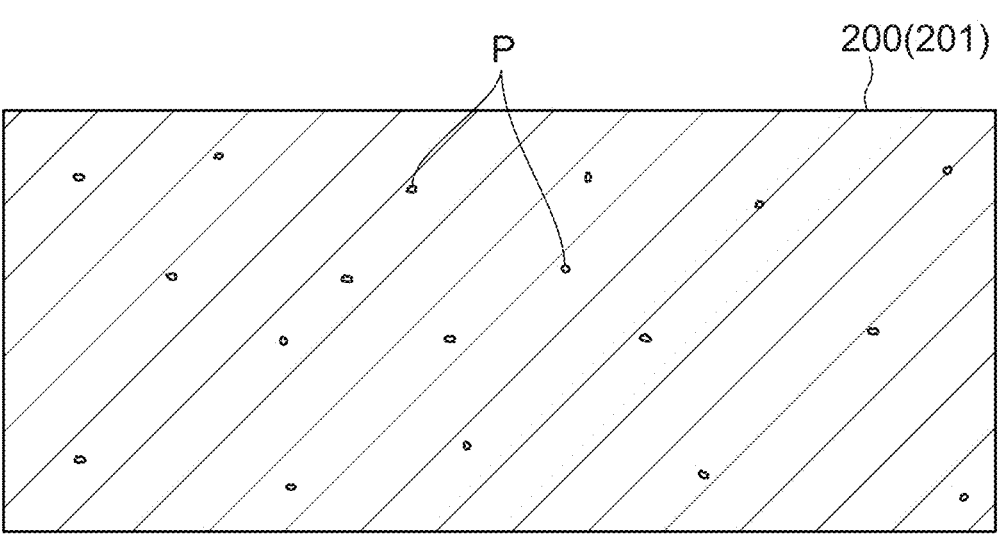
FIG. 5A shows a schematic diagram of a cross-section of the structural member according to the modification of the present embodiment.
Figure 5B:
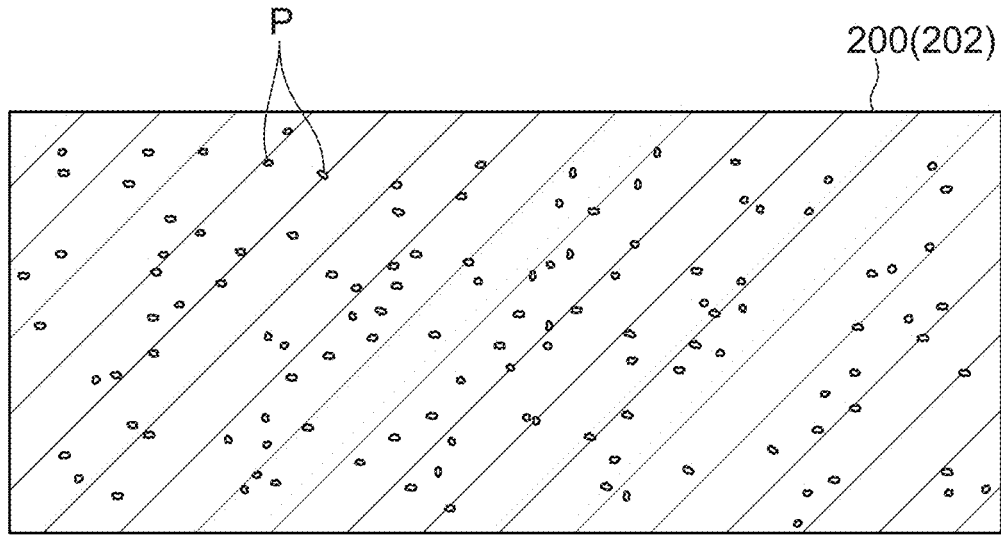
FIG. 5B shows a schematic diagram of a cross-section of the structural member according to the modification of the present embodiment.
Figure 6:
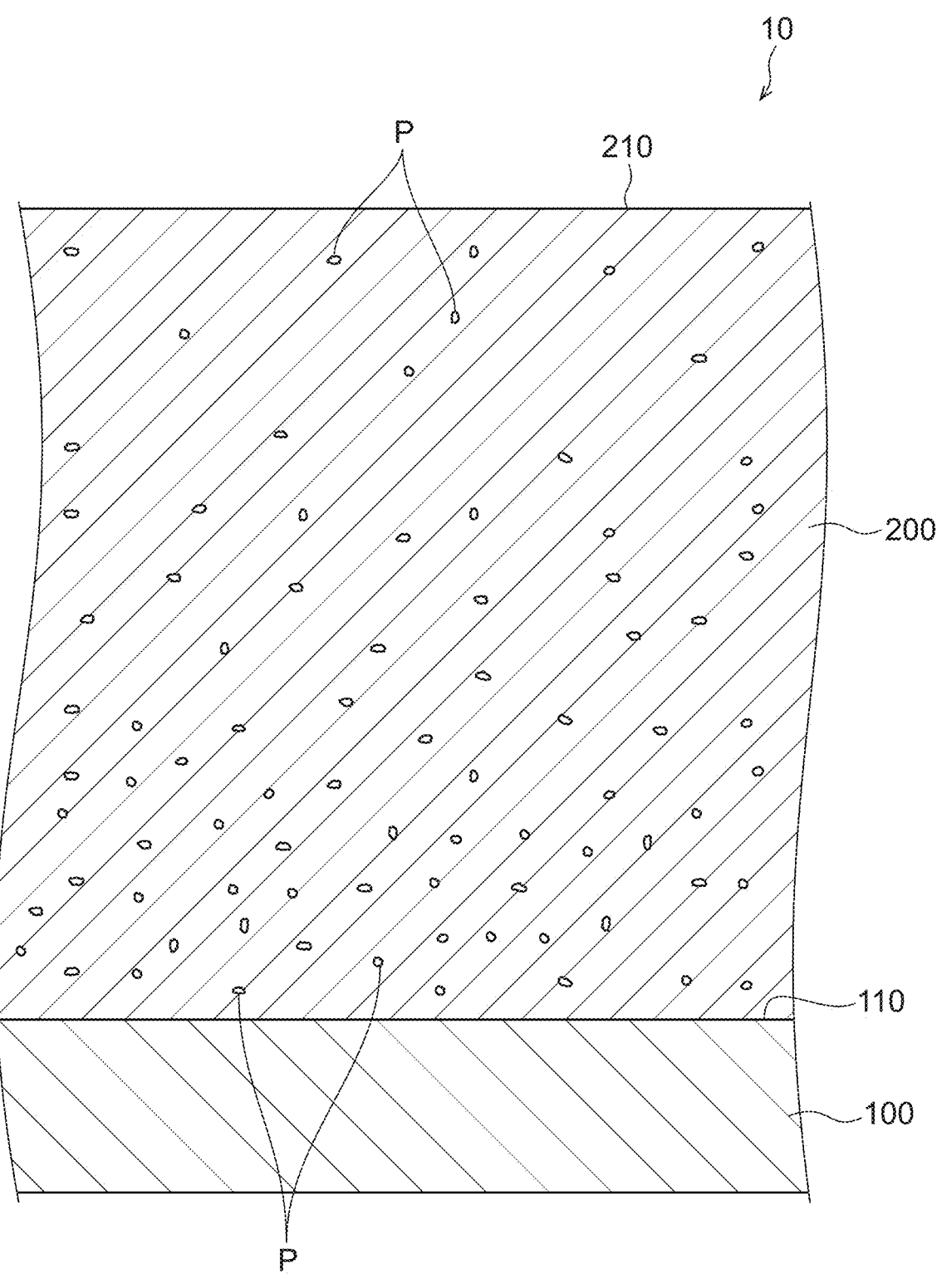
FIG. 6 shows a schematic diagram of a cross-section of the structural member according to the modification of the present embodiment.

FIG. 6 schematically depicts the distribution of pores P in the protective film 200 according to the modifications of FIG. 5A and FIG. 5B, as in FIG. 4. As shown in FIG. 6, in the protective film 200 of this modification, over the entire range from the surface 210 to the surface 110, the number of pores P per unit area gradually decreases with increasing distance from the base material 100. Accordingly, the porosity value in each portion of the protective film 200 gradually (i.e., continuously) decreases with increasing distance from the base material 100, and as a result, the porosity in the first portion 201 and the second portion 202 differs from each other.

The protective film 200 with the porosity value adjusted as described above may be formed by stacking a plural types of films with different chemical compositions from each other; however, in this case, for example, defects may result at a boundary of the different types of films accompanying their thermal expansion differences. Therefore, a protective film 200 in its entirety is preferably formed so that the chemical composition of materials is the same, as in the present embodiment. Namely, the chemical composition of the protective film 200 in the first portion 201 and the chemical composition of the protective film 200 in the second portion 202 are preferably the same as each other. The chemical composition being the "same" means that a ratio of elements constituting the protective film 200 is the same in each portion. The phrase the "elements constituting the protective film 200" may include an element that is mixed into the protective film 200 as an impurity; however, identity of the "chemical composition" may be evaluated after excluding such an element.

The entire protective film 200 of the present embodiment is also substantially uniform in a crystallite size. The term "crystallite size" is an average value of diameters of a plurality of crystallites that appear in a cross-section of the protective film 200 cut perpendicularly to the surface 110.

The crystallite size can be calculated, for example, by taking a transmission electron microscope (TEM) image at magnification of 400,000 times or more and averaging the diameters of 15 approximately-circular crystallites in this image. In this case, a sample thickness upon FIB (Focused Ion Beam) processing being sufficiently thin (approximately 30 nm), allows crystallites to be able to be more clearly identified. The magnification can be appropriately selected in a range of 400,000 times or more.

In the protective film 200 of the present embodiment, the crystallite size measured by the aforementioned method is substantially uniform in the entire protective film 200, and is specifically 50 nm or smaller. In other words, the crystallite size of the protective film 200 in the first portion 201 and the crystallite size of the protective film 200 in the second portion 202 are both 50 nm or less. By making the crystallite size of the protective film 200 substantially uniform in its entirety, the durability of the protective film 200 can be improved.

Various methods can be employed to adjust the porosity of each portion of the protective film 200.

For example, in forming a protective film 200 by using the aerosol deposition method, porosity of each portion may be adjusted by changing deposition conditions each time. Those who are skilled in the art of film formation by the aerosol deposition method have accumulated know-how on deposition conditions in order to inhibit formation of bubbles. In other words, deposition conditions so as to increase a cross-sectional area of a bubble and deposition conditions so as to increase a density of bubbles arranged, have also been accumulated as know-how. Therefore, deposition by utilizing the knowledge allows protective film 200 with the porosity distributions as shown in FIG. 4 and FIG. 6 to be easily formed.

In forming of the protective film 200, for example, depositing a portion on a base material 100 side by using a porous raw material until the middle of the deposition also enables adjustment of porosity.

In forming of the protective film 200, for example, depositing a portion on a base material 100 side by using a raw material containing a pore forming material until the middle of the deposition also enables adjustment of porosity. The pore forming material to be used may be, for example, a material that disappears upon heating, such as resin beads. By heating the entire structural member 10 after completion of deposition, a protective film 200 with adjusted porosity can be obtained.

In forming of the protective film 200, for example, by using a material mixed with a material having a different coefficient of thermal expansion from that of the main material until the middle of the deposition, a portion on a base material 100 side may be formed. After completion of the deposition, the entire structural member 10 may be heated to generate pores at an interface between the different materials to obtain a protective film 200 with adjusted porosity.

After forming of the protective film 200 in the same manner as conventional methods, the entire structural member 10 may be heated. Performing heating under the prescribed conditions, generates particle growth in the protective film 200, and therefore pores can also be locally created in the course thereof.

So far, the present embodiments have been described with reference to specific examples. However, the present disclosure is not limited to these specific examples. Design changes appropriately made to these specific examples by those skilled in the art are also included in the scope of the present disclosure as long as they include the features of the present disclosure. Each element included in each of the aforementioned specific examples, as well as their arrangement, conditions, shapes, and the like, are not limited to those exemplified, and can be appropriately changed. Each element included in each of the aforementioned specific examples can be appropriately combined as long as no technical inconsistency thereof results.

What is claimed is:

1. A structural member comprising a base material and a protective film covering a surface of the base material, wherein a coefficient of thermal expansion of the protective film is different from a coefficient of thermal expansion of the base material, wherein when, in a cross-section of the protective film cut perpendicularly to the surface, a proportion of pores per unit area is defined as porosity, the porosity in a first portion that is a portion of the cross-section is lower than the porosity in a second portion that is a portion of the cross-section closer to a base material side thereof than the first portion, wherein an average value of cross-sectional areas per pore of pores included in the first portion is smaller than an average value of cross-sectional areas per pore of pores included in the second portion.

2. The structural member according to claim 1, wherein, in the cross-section, the porosity gradually decreases with increasing distance from the base material.

3. The structural member according to claim 1, wherein a chemical composition of the protective film in the first portion and a chemical composition of the protective film in the second portion are the same as each other.

4. The structural member according to claim 1, wherein a crystallite size of the protective film in the first portion and a crystallite size of the protective film in the second portion are both 50 nm or less.

5. The structural member according to claim 1, wherein the protective film is a film formed by an aerosol deposition method.

* * * * *